United States Patent
Kondo et al.

(10) Patent No.: US 6,399,203 B1
(45) Date of Patent: Jun. 4, 2002

(54) PYROLYTIC CARBON COATED CARBON FIBER REINFORCED CARBON COMPOSITE AND USEFUL AS COMPONENTS FOR PULLING SINGLE CRYSTAL APPARATUS

(75) Inventors: Teruhisa Kondo, Osaka; Naoto Ohta, Kagawa; Toshiaki Sogabe, Kagawa; Masatoshi Yamaji, Kagawa, all of (JP)

(73) Assignee: Toyo Tanso Co., Ltd., Osaka (JP)

( * ) Notice: Subject to any disclaimer, the term of this patent is extended or adjusted under 35 U.S.C. 154(b) by 0 days.

(21) Appl. No.: 09/457,739

(22) Filed: Dec. 10, 1999

(30) Foreign Application Priority Data

Jun. 8, 1999 (JP) .......................................... 11-160371

(51) Int. Cl.⁷ ................................................ B32B 9/00
(52) U.S. Cl. ...................... 428/408; 442/179; 117/208
(58) Field of Search ...................... 428/408; 442/179; 117/208, 200, 13

(56) References Cited

U.S. PATENT DOCUMENTS 5,616,175 A 4/1997 Walsh
5,683,281 A 11/1997 Metter
5,800,924 A 9/1998 Metter

FOREIGN PATENT DOCUMENTS

WO WO 91/04954 4/1991

*Primary Examiner*—Deborah Jones
*Assistant Examiner*—Wendy Boss
(74) *Attorney, Agent, or Firm*—Oblon, Spivak, McClelland, Maier & Neustadt, P.C.

(57) ABSTRACT

Since the dense and high purity pyrolytic-carbon-coated layer is formed with a thickness of 10–100 μm on the surface of the C/C composite, even when metallic impurities of the inside C/C composite are 5–100 ppm in ash content, similar effects to those of a known crucible made of the C/C composite whose inside was subjected to high purification can be produced to achieve full applicability to the structural elements of the CZ apparatus. Also, since the process time required or the C/C composite itself to be subjected to the high purification can be shortened, the effect of reducing the manufacturing costs considerably can be obtained.

6 Claims, 1 Drawing Sheet

PYROLYTIC CARBON COATED CARBON FIBER REINFORCED CARBON COMPOSITE AND USEFUL AS COMPONENTS FOR PULLING SINGLE CRYSTAL APPARATUS

BACKGROUND OF THE INVENTION

1. Technical Field

The present invention is directed to pyrolytic carbon coated carbon fiber reinforced carbon composite and useful as components for pulling single crystal apparatus.

2. Description of the Related Art

FIG. 1 shows a pulling single crystal apparatus used in the Czochralski process for manufacturing a single crystal ingot for use as a material of the semiconductor wafer and the like (hereinafter it is referred to as the CZ apparatus). As shown in FIG. 1, the CZ apparatus is so structured that a raw material in a quartz crucible 4 is heated to a high temperature by a heater 7 disposed around the quartz crucible 4 so that the raw material can be converted into the melt 5 which is pulled under reduced pressure to form the single crystal ingot 3.

The structural elements, such as a crucible 8 supporting the quartz crucible 4 and an upper ring 12, a lower ring 9 and an inner shield 11 which are subjected to radiant heat of the heater 7, are exposed to high temperature when pulling a single crystal ingot 3 from the quartz crucible 4 within a molten silicon. Accordingly, the structural elements must be formed of a material that can maintain a prescribed mechanical strength under high temperature. Further, the structural elements must be formed of a material of high-purity, because impurities, such as metals, contained in the structural elements become a cause of crystal defects in orientation of the solidifying of the single crystal ingot 3 and also become a factor of reduction of purity, when leaked during manufacturing. In general, a high purity graphite having excellent mechanical properties at high temperature and having high-purity is used for the structural elements of the CZ apparatus (Japanese Patent Publication No. Hei 6(1994)-35325). Recently, with increasing diameter of the single crystal, the single crystal pulling apparatus used in the CZ process is increased in size. This produces a handling problem caused by the increased weights for the existing graphite elements and a problem of reduction in effective processing size of the inside of the apparatus.

The carbon fiber reinforced carbon composite (C/C composite) has the properties of lightweight and excellent mechanical strength, as compared with the graphite material. By virtue of this, even when reducing in thickness, the structural elements of the C/C composite can have a strength equal to those of the graphite material, to enable an effective use of a processing chamber of the apparatus. In addition, by virtue of being lightweight, a good handling can be achieved in, for example, placement in the apparatus. By virtue of these, the crucible components used in the CZ apparatus having a large diameter are now moving from those made of the graphite to those made of the C/C composite.

Recently, the elements for use in the CZ apparatus made of a high purity C/C composite have been proposed. For example, U.S. Pat. Nos. 5,683,281 and No. 5,800,924 disclose a high purity C/C composite subjected to degasification at 2,400° C. to 3,000° C. under an inert gas atmosphere in its carbon fiber stage; impregnation with high purity pitch or resin for densification; graphitization; and high purification at 2,400° C. to 3,000° C. under a halogen gas atmosphere, so that the metal impurities of Ag, Al, Ba, Be, Ca, Cd, Co, Cr, Cu, K, Mg, Mn, Mo, Na, Ni, P, Pb, Sr and Zn can be reduced below the detection limit by inductively coupled plasma spectroscopy (ICP). U.S. Pat. No. 5,616,175 discloses a 3-D C/C composite for pulling single crystal apparatus which is impregnated with the carbon material which results in a matrix and then graphitized, followed by high purification under a halogen gas, so that the impurities can be not more than 10 ppm and whose surface is coated with pyrolytic carbon or silicon carbide, for in preventing its reaction with the gas generated from melt 5 when the single crystal is pulled.

These prior invention disclose that the carbon fibers forming the C/C composite are subjected to the high purification process so that the impurity gas released from the inside can be minimized to achieve the C/C composite applicable to manufacturing of semiconductor or the C/C composite for the CZ apparatus, in particular.

However, in order to achieve the C/C composite applicable to the CZ apparatus, the C/C composite must be purified for a long time at high temperature over 2,000° C. under a halogen gas atmosphere. Recently, with increasing diameter of the single crystal ingot, the CZ apparatus is increased in size, which in turn increases the size of the C/C composite. With this recent trend, the need is arising for an expensive and large-sized furnace for the C/C composite to be high purified and for more process time. This inevitably involves increase in manufacturing costs.

SUMMARY OF THE INVENTION

It is the object of the present invention to provide a C/C composite, which has such purity as to be applicable to the CZ apparatus, and whose surface is coated with pyrolytic carbon so that process time and manufacturing costs can be reduced.

To accomplish the above the object, the inventors devoted themselves on the concerned study and discovered that when the whole surface of the C/C composite is coated with pyrolytic carbon with a predetermined thickness or more, impurity gas generated from a pyrolytic-carbon-uncoated inside of the C/C composite can be shielded in a pyrolytic-carbon-coated inside thereof to achieve the applicability of the C/C composite to the CZ apparatus. Based on this discovery, the inventors have completed the present invention.

A pyrolytic-carbon-coated C/C composite of the present invention is characterized in that a total ash content of the coated pyrolytic carbon is not more than 5 ppm and a total ash content of the pyrolytic-carbon-uncoated inside of the C/C composite is 5 to 100 ppm.

DETAILED DESCRIPTION OF THE INVENTION

Figure 1:
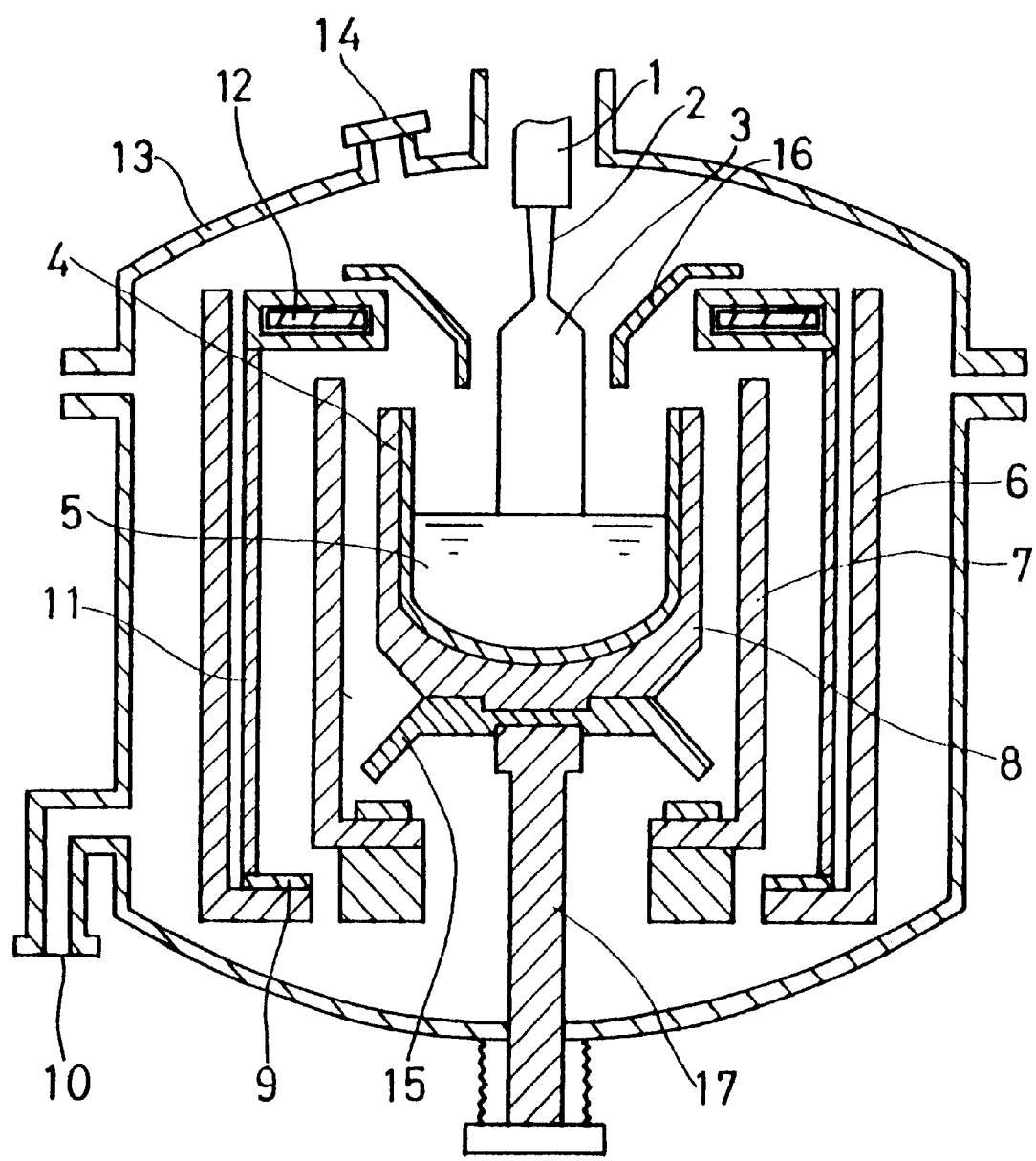
FIG. 1 is a schematic cross sectional views of the CZ apparatus.

The total ash content of the pyrolytic carbon with which the entire surface of the C/C composite is coated is not more than 5 ppm, preferably not more than 3 ppm, and the total ash content of the inside of the C/C composite is 5 to 100 ppm. Further, it is desirable that the ash content of the C/C composite is preferably 5 to 20 ppm, more preferably 5 to 10 ppm when using to the CZ apparatus.

The total ash content is determined by following method. The sample of 20 g measured precisely and filled in a crucible made of platinum (50 cc capacity) was heated at 950° C. in the oxygen stream (2 to 3 l/min) until it reached the constant weight and then was spontaneously cooled in a desiccator, and then the remaining ash content was measured.

The pyrolytic-carbon-coated C/C composite of the present invention is 10 to 100 μm in thickness of the pyrolytic-carbon-coated layer on the surface and a part of the pyrolitic carbon is impregnated in advance into the inside of the C/C composite.

The thickness of the pyrolytic-carbon-coated in layer on the surface is 10 to 100 μm, preferably 20 to 60 μm. This enables the impurity gas generated from the inside of the C/C composite to be suppressed. With the thickness of the coated layer of less than 10 μm, there is provided an undesirable result that when impurity gas is generated much from the inside of the C/C composite, the pyrolytic-carbon-coated layer on the surface may be peeled off by the gas pressure from the inside. With the thickness of the pyrolytic-carbon-coated layer of less than 10 μm, the non-gas-permeability may be deteriorated. With the thickness of the coated layer in excess of 100 μm, although the coated layer can shield the gas generated from the inside, there is provided an undesirable result that when subjected to heat history repeatedly, the coated layer may be peeled off by the thermal stress.

The inside of the C/C composite can be produced by a conventional C/C composite manufacturing process and need not be purified repeatedly. For the carbon fibers, PAN-base or pitch-base carbon fibers can be used. Also, impregnating the carbon material comprising pitch, phenol and pyrolytic carbon into a molded member formed of the carbon fibers forms the matrix available for densification.

The pyrolytic carbon used herein is intended to include high purity carbonaceous material or graphite material obtained by pyrolyzing hydrocarbons including hydrocarbon gases of 1 to 8 carbons, particularly 3 carbons, such as propane and methane gas.

In the pyrolytic-carbon-coated C/C composite of the present invention, the PAN-base or pitch-base carbon fibers are prepared, first. Then, the carbon fibers are subjected to high purification at 1,800° C. to 2,200° C. under a halogen gas atmosphere (first high purification process). The halogen gas used including halogen or gas of a compound thereof.

The halogen gases which may be used include chlorine, chlorine compound, fluorine and fluorine compound, together with compounds including chlorine and fluorine in the same molecule (monochlorotrifluoromethane, trichloromonofluoromethane, dichlorofluoroethane, trichloromono-fluoroethane and the like). Then, the carbon fibers are allowed to react with these halogen gases, whereby the impurities included in carbon fibers, metallic impurities in particular, are evaporated and volatilized as halide and removed from the carbon fibers. Thereafter, after the carbon fibers are allowed to stand in the same processing furnace for a prescribed time under a halogen gas atmosphere, hydrogen gas is fed to a reaction vessel so that the impurities, such as sulfur, can be deposited as hydride and thereby be removed. This can achieve the total ash content of the carbon fibers of not more than 100 ppm, preferably not more than 80 ppm, in the ash content determined method.

After the impurities in the carbon fibers are removed by the high purification process, the carbon fibers are impregnated with the pitch or resin for densification, and are baked at temperature 800° C. to 1,200° C., and thereby these carbon fibers which results in the matrix are carbonized. The densifying step and the carbonizing step are repeated 2 or 3 times. It is noted that although no particular limitation is imposed on the resin used, as long as it is the one that converts into solid phase carbon, one resin selected from the group including phenol (resole, novolak), furan, polyimide, polyamide-imide, polyether imide, polycarbodiimide and bisallyldiimide or combination thereof may be used within the range within which its property is not impaired. Solvent may be used in combination, when necessary. It is preferable that the molded member after densified is 1.4 to 1.6 g/cm$^2$ in bulk density and 5 to 20% in porosity, in that in the high purification process, the high purified gas can easily be diffused into the inside and thus the impurity gas in the inside can be removed easily.

For the purpose of high purification and graphitization, the molded member subjected to densification to have a prescribed porosity is subjected to high purification and graphitization under a halogen gas atmosphere at temperature (1,800° C. to 2,400° C.) equal to or higher than the first purification process temperature by 100° C. to 200° C. for 5 to 30 hours. This can achieve the total ash content of the molded member of not more than 100 ppm, preferably not more than 80 ppm, further preferably not more than 60 ppm, in the ash content determined method. Further, it is desirable that the ash content is not more than preferably 20 ppm, more preferably not more than 10 ppm for CZ apparatus.

The surface coating with pyrolytic carbon is performed by Chemical Vapor Deposition (CVD). The CVD referred to be intended to include Chemical Vapor Impregnation (CVI) for the pyrolytic carbon to permeate and precipitate to the inside from the pores. In the CVD using the hydrocarbons or hydrocarbon compounds, the concentration of the hydrocarbon is controlled to be 3 to 30%, preferably 5 to 15%, and the total pressure is controlled to be less than 13 kPa, preferably less than 6.5 kPa. In this controlling process, the hydrocarbon forms a large carbon compound in the vicinity of the surface of the base material by the dehydrogenation, thermal decomposition, polymerization and the like, and the large carbon compound is deposited and precipitated on the base material. Then, the dehydrogenation reaction proceeds further, so that a dense pyrolytic carbon layer is formed on the base material or the carbon compound is permeated to be impregnated into the base material. While the temperature range for the precipitation is in general so broad as 800° C. to 2,500° C., it is preferable that the processes are performed within a relative low temperature range of 1,300° C. or less, to achieve maximum pyrolytic carbon impregnation. Also, the precipitation time is set to 50 hours or more, preferably 100 hours or more, to enable the pyrolytic carbon to be formed in the inside, and subsequently the base material is coated with the pyrolytic carbon at 1,800 ° C. or more, to form a film of the coated layer having a thickness of 100 μm or less. The precipitation time of 50 hours or more, or preferably 100 hours or more, enables the pyrolytic carbon to be formed in every space between the fibers, so that the fibers in the inside of the base material are also coated with the pyrolytic carbon. This contributes to prevention of the gas generated from the inside of the base material. For achieving the enhanced impregnation, the isothermal method, the temperature gradient method, the pressure gradient method and the like may be used. Also the pulse method may be used for achieving the shortened process time and the purification.

The CVD can control the total ash content of the pyrolytic carbon to not more than 5 ppm in the ash content determined method, to ensure application to the CZ apparatus components. The CZ apparatus components referred to in this application correspond to all known graphite components used in the CZ apparatus, including the crucible, the heater, the upper ring, the lower ring, the inner shield, the seed chuck and etc.

While the present invention is described below more specifically with reference to the following examples, embodiments of the present invention are by no means limited to the following examples.

EXAMPLE 1

A layer of a plain weave cloth (T-300 6K, made by TORAY INDUSTRIES, INC.) impregnated with phenol resin was laminated on a mandrel, followed by application of the filament windings thereon. The using filaments of the filament windings were heated to 2,000° C. under a halogen gas atmosphere for 10 hours (the first high purification process). In the filaments windings, with six filaments of T-300 12K (Made by TORAY INDUSTRIES, INC.) were impregnating with phenol resin, the level winding and the parallel winding of a contact angle of 85° to 90° with respect to the center axis were alternately wound 5 layers each. While the drum is allowed to have 10 layers of the alternate parallel and level windings, the bottom is allowed to have the layers of the level windings only. As a result of this, the molded member having a thickness of layer of 10 mm was obtained. Subsequently, the volatile matter of the obtained molded member was adjusted in an oven at 100° C. and, thereafter, the molded member was solidification by increasing the temperature of the oven up to 200° C. After having been solidification, the molded member was removed from the mandrel to obtain the molded member. Then, the molded member was increased in temperature up to 1,000° C. at the heating ratio of 10° C./hr in an electric oven, to obtain the C/C composite. The ash content was 76 ppm. Further, the molded member was subjected to a pitch impregnation process and then was increased in temperature up to 1,000° C. at the heating ratio of 10° C./hr in the electric oven with nitrogen flow for baking. The baking process was repeated twice to obtain the molded member having 10% porosity. Further, as a final heat-treatment, the molded member was heated up to 2,000° C. under 101 kPa of halogen gas atmosphere for the graphitization and the second high purification process. The ash content of the C/C composite before being coated with the pyrolytic carbon was 50 ppm. Thereafter, the molded member was machined and formed into a specified form. After the machining process, for the purpose of being impregnated and coated with pyrolytic carbon, the molded member was set in a vacuum furnace into which methane gas was supplied and to keep for 100 hours under the pressure inside the vacuum furnace of 3.3 kPa, followed by being impregnated and coated with the pyrolytic carbon by the CVD process, to thereby produce the end product.

The pyrolytic-carbon-coated layer was found to be 40 $\mu$m in thickness by the CVD process and 1.55 g/cm$^3$ in bulk density.

EXAMPLE 2

Except the process time of the CVD process of 50 hours and the thickness of the pyrolytic-carbon-coated layer of 20 $\mu$m, the same processes as those of Example 1 were performed to thereby produce a crucible whose surface is coated with dense and high purity pyrolytic carbon. Then, a test in actual use was conducted by use of the CZ apparatus the same manner as in Example 1.

EXAMPLE 3

Except the process time of the CVD process of 150 hours and the thickness of the pyrolytic-carbon-coated layer of 60 $\mu$m, the same processes as those of Example 1 were performed to thereby produce a crucible whose surface is coated with dense and high purity pyrolytic carbon. Then, the test in actual use was conducted by use of the CZ apparatus in the same manner as in Example 1.

COMPARATIVE EXAMPLE 1

Except that the high purification process was conducted at the carbon fiber stage and that the impurities in the molded member was not more than 5 ppm at the stage at which the molded member using the carbon fibers is not yet impregnated and coated with pyrolytic carbon by the CVD process, the crucible for use in the CZ apparatus was produced in the same manner as in Example 1. The crucible thus produced had a similar form to that of Example 1, having impurities of not more than 5 ppm in the inside as well as in the surface. Then, the test in actual use was conducted by use of the CZ apparatus in the same manner as in Example 1.

COMPARATIVE EXAMPLE 2

Except that the CVD process was not taken, the crucible for use in the CZ apparatus was produced in the same manner as in Example 1. Then, the test in actual use was conducted by use of the CZ apparatus in the same manner as in Example 1.

REFERENCE EXAMPLE 1

Except the CVD process time of 10 hours and the thickness of the pyrolytic-carbon-coated layer of 5 $\mu$m, the same processes as those of Example 1 were performed to thereby produce a crucible for use in the CZ apparatus. Then, the test in actual test was conducted by use of the CZ apparatus in the same manner as in Example 1.

REFERENCE EXAMPLE 1

Except the CVD process time of 200 hours and the thickness of the pyrolytic-carbon-coated layer of 120 $\mu$m, the same processes as those of Example 1 were performed to thereby produce a crucible for use in the CZ apparatus. Then, the test in actual use was conducted by use of the CZ apparatus in the same manner as in Example 1.

The tests in actual use were conducted of the crucibles of the C/C composites coated with dense and high purity pyrolytic carbon according to Examples 1 to 3, to measure their properties including the fiber content ratio, the bulk density and the bending strength. Also, their ash content was measured. The fiber content ratio was calculated from the weight and bulk density of the fibers and the bulk density of the products. The bulk density was calculated from the sizes and weights. The bending strength was measured by a three-point bending test with a span of 40 mm. The ash content was measured precisely and filled in the platinum crucible having a 50 cc capacity, was heated at 950° C. in the oxygen stream (2 to 3 l/min) until it reached the constant weight, as aforementioned. Then, the test example was spontaneously cooled in the desiccator and the remaining ash content was measured.

The physical properties of the test samples are listed in Table 1.

The test examples in actual use of crucibles of Examples 1 to 3 were conducted in 100 batches, and it was found that no particular problems presented in the as pulled single crystal ingot, as is the case of the known crucible of the known C/C composite whose inside is also high purity. Particularly, there developed no cracks or peeling in the pyrolytic-carbon-coated layer on the surface, and the crucibles of Examples 1 to 3 were found to be in no way inferior to the crucible of Comparative Example 1 whose inside ash content is not more than 5 ppm. Thus, it was found that the C/C composite according to the present invention showed such properties as to be applicable as the CZ apparatus, e.g. durability, comparable with those of Comparative Example 1 and equivalent which are subjected to high purification to achieve the ash content of the pyrolytic carbon of not more than 5 ppm in both the inside C/C composite and the surface at high manufacturing costs.

TABLE 1

| | Fiber content ratio vol % | Bulk density g/cm$^3$ | Bending strength MPa | Purity of inside of C/C composite ppm | Coating thickness μm | Test result in actual use |
|---|---|---|---|---|---|---|
| Example 1 | 55 | 1.55 | 200 | 50 | 40 | Use in 100 batches No problem |
| Example 2 | 55 | 1.50 | 180 | 50 | 20 | Use in 100 batches No problem |
| Example 3 | 55 | 1.60 | 215 | 50 | 60 | Use in 100 batches No problem |
| Comparative Example 1 | 55 | 1.55 | 200 | <5 | 40 | Use in 100 batches No problem |
| Comparative Example 2 | 55 | 1.45 | 150 | 50 | 0 | Surface is silicified in 1 batch |
| Reference Example 1 | 55 | 1.48 | 165 | 50 | 5 | Cracks develop in 10 batches |
| Reference Example 2 | 55 | 1.62 | 210 | 50 | 120 | Cracks develop in 5 batches |

What is claimed is:

1. A pyrolitic carbon coated carbon fiber reinforced carbon composite, wherein a total ash content of the pyrolytic carbon is not more than 5 ppm and an ash content of inside of the carbon fiber reinforced carbon composite before coating with pyrolytic carbon is 5 to 100 ppm, and wherein the coating thickness of said pyrolytic carbon is 10 to 100 μm and a part of said pyrolytic carbon is impregnated in advance into the inside of said carbon fiber reinforced carbon composite.

2. A pyrolitic carbon coated carbon fiber reinforced carbon composite, wherein a total ash content of the pyrolytic carbon is not more than 5 ppm and an ash content of inside of the carbon fiber reinforced carbon composite before coating with pyrolytic carbon is 5 to 100 ppm, and wherein the coating thickness of said pyrolytic carbon is 20 to 60 μm and a part of said pyrolytic carbon is impregnated in advance into the inside of said carbon fiber reinforced carbon composite.

3. The pyrolytic carbon coated carbon fiber reinforced carbon composite according to claim 1, wherein said total ash content of said pyrolytic carbon is not more than 3 ppm.

4. The pyrolytic carbon coated carbon fiber reinforced carbon composite according to claim 1, wherein said ash content of said inside of said carbon fiber reinforced carbon composite before coating with pyrolytic carbon is 5 to 20 ppm.

5. The pyrolytic carbon coated carbon fiber reinforced carbon composite according to claim 1, wherein said ash content of said inside of said carbon fiber reinforced carbon composite before coating with pyrolytic carbon is 5 to 10 ppm.

6. A pulling single crystal apparatus using the pyrolytic carbon coated carbon fiber reinforced carbon composite according to any one of claims 1 to 5.

* * * * *